(12) United States Patent
Nezuka

(10) Patent No.: US 9,077,373 B1
(45) Date of Patent: Jul. 7, 2015

(54) ANALOG-TO-DIGITAL CONVERSION APPARATUS

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/595,400

(22) Filed: Jan. 13, 2015

(30) Foreign Application Priority Data

Jan. 14, 2014 (JP) .................................. 2014-4256

(51) Int. Cl.
*H03M 3/00* (2006.01)
(52) U.S. Cl.
CPC .............. *H03M 3/458* (2013.01); *H03M 3/422* (2013.01)
(58) Field of Classification Search
CPC .......... H03M 3/30; H03M 3/02; H03M 3/458
See application file for complete search history.

(56) References Cited

U.S. PATENT DOCUMENTS

| | | | |
|---|---|---|---|
| 4,862,943 | A | 9/1989 | Shafia |
| 5,101,206 | A | 3/1992 | Riedel |
| 5,189,419 | A | 2/1993 | Lyden |
| 5,844,514 | A | 12/1998 | Ringh et al. |
| 5,936,562 | A | 8/1999 | Brooks et al. |
| 7,289,054 | B1 | 10/2007 | Watanabe |
| 7,486,217 | B2 | 2/2009 | Matsushita et al. |
| 7,486,218 | B2 * | 2/2009 | Horie ............................ 341/163 |
| 7,504,977 | B2 | 3/2009 | Doorenbos et al. |
| 7,916,061 | B2 | 3/2011 | Chae et al. |
| 8,451,051 | B2 * | 5/2013 | Chen ............................ 327/554 |

OTHER PUBLICATIONS

Ramesh Harjani and Tom A. Lee, "FRC: A Method for Extending the Resolution of Nyquist Rate Converters Using Oversampling." IEEE Transactions on Circuits and Systems—II: Analog and Digital Signal Processing, vol. 45, No. 4, Apr. 1998, pp. 482-494.
Pieter Rombouts et al., "A 13.5-B 1.2-V Micropower Extended Counting A/D Converter." IEEE Hournal of Solid—State Circuits, vol. 35, No. 2, Feb. 2001, pp. 176-183.

* cited by examiner

*Primary Examiner* — Khai M Nguyen
(74) *Attorney, Agent, or Firm* — Posz Law Group, PLC

(57) ABSTRACT

An A/D conversion apparatus includes a signal processor, a quantizer, and a controller. The signal processor has circuit blocks connected in a loop to process an analog input signal. The quantizer generates a quantization value by quantizing an output of at least one of the circuit blocks including a final-stage circuit block. In each circuit block, one end of a first capacitor is connected through a switch to an input terminal of an operational amplifier, and one end of each of second and third capacitors is connected directly to the operational amplifier. The controller generates an A/D conversion result of the analog input signal according to the quantization value and changes connection conditions of the capacitors so that the signal processor and the quantizer function as a delta-sigma modulator or a cyclic A/D converter.

7 Claims, 14 Drawing Sheets

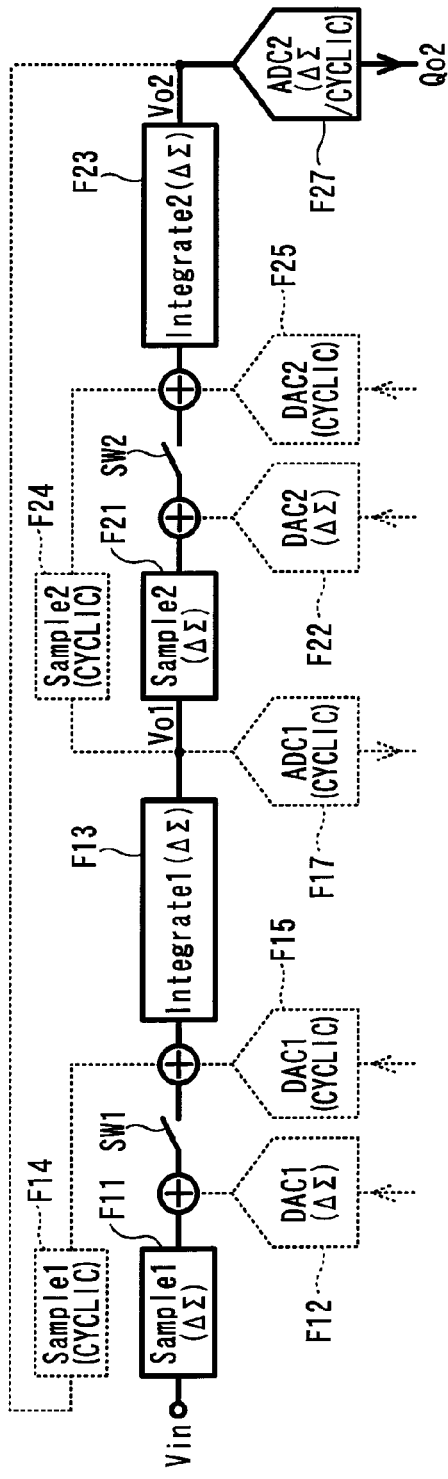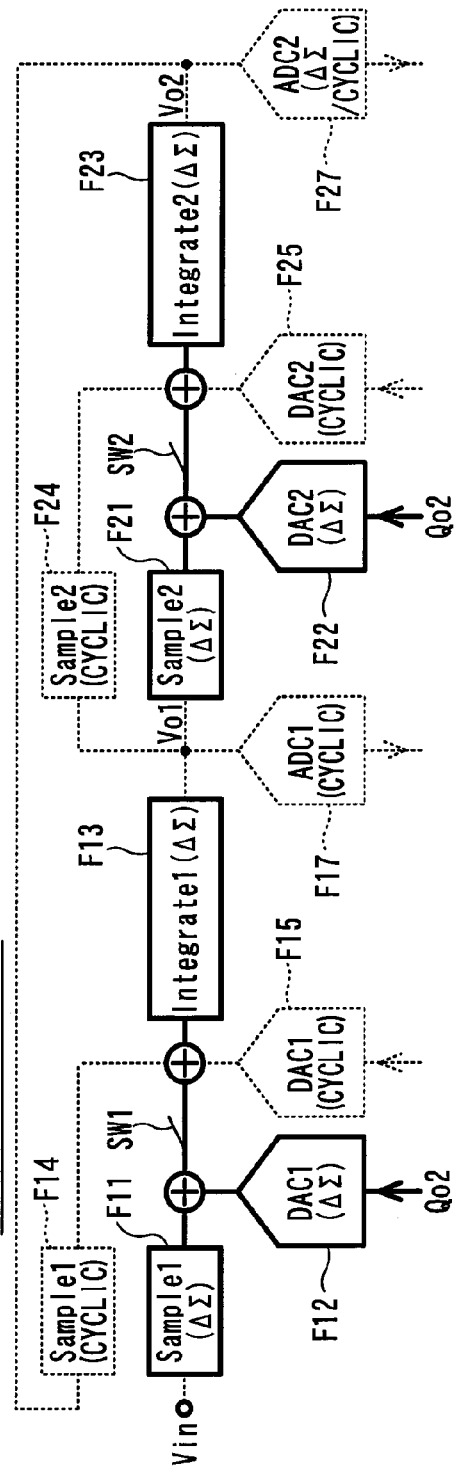

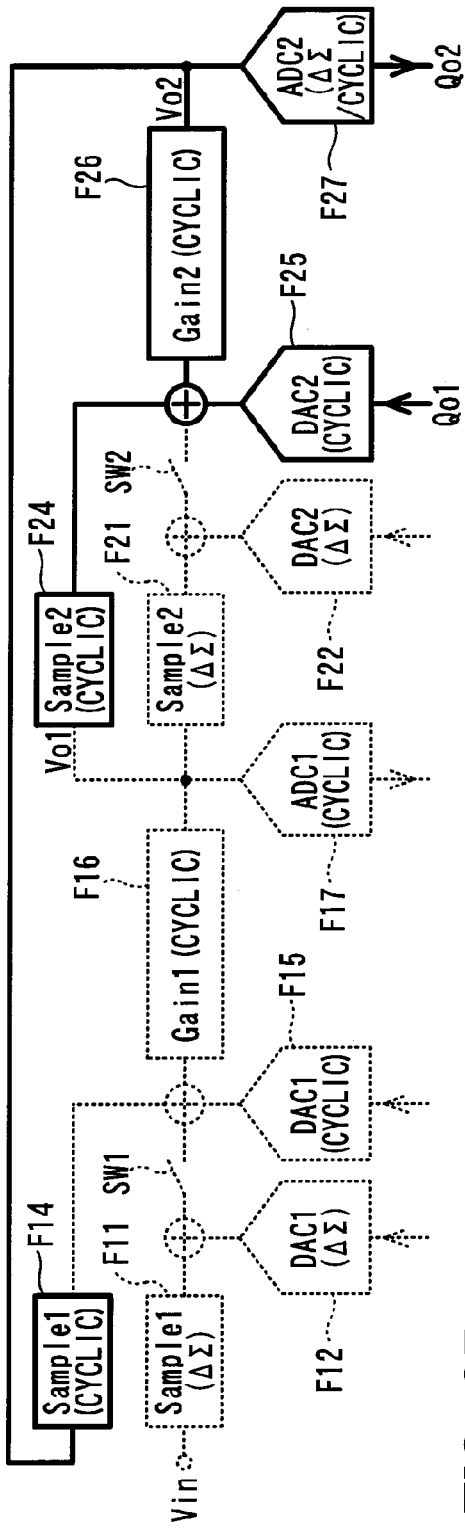
FIG. 9A CYCLIC MODE (ODD PHASE)
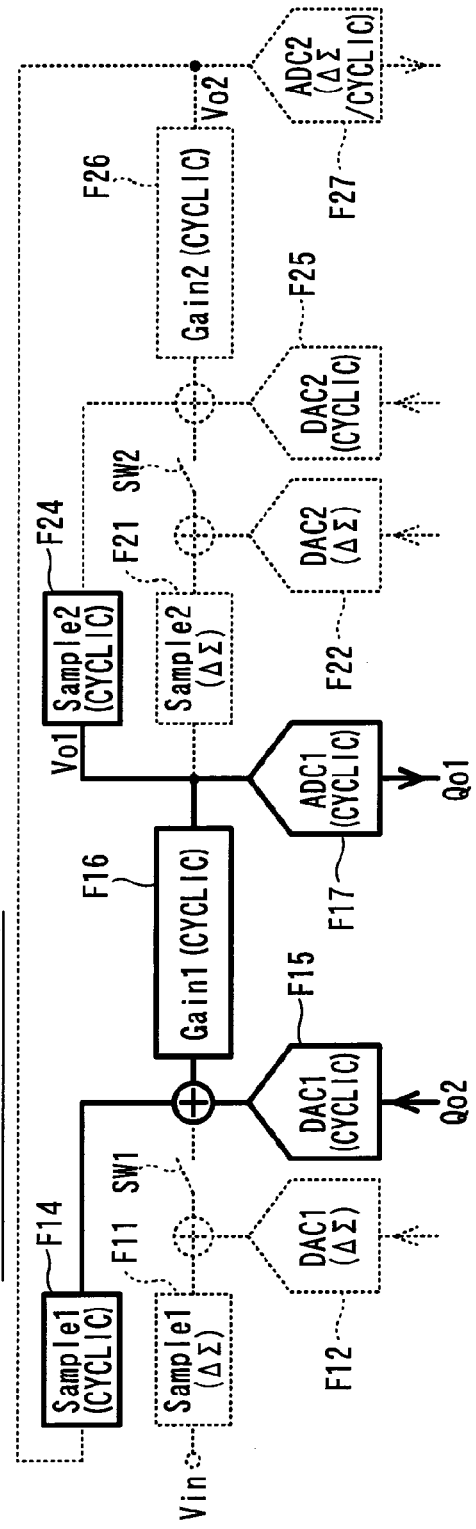
FIG. 9B CYCLIC MODE (EVEN PHASE)

US 9,077,373 B1

ANALOG-TO-DIGITAL CONVERSION APPARATUS

CROSS REFERENCE TO RELATED APPLICATION

This application is based on and claims priority to Japanese Patent Application No. 2014-4256 filed on Jan. 14, 2014, the contents of which are incorporated herein by reference.

FIELD

The present disclosure relates to a hybrid analog-to-digital (A/D) conversion apparatus in which a delta-sigma A/D converter and a cyclic A/D converter are combined so that they can share part of their circuits and perform their respective A/D conversions by operation mode switching.

BACKGROUND

An A/D conversion apparatus has been proposed that generates most significant bits of an A/D conversion result by performing A/D conversion of an analog input signal using a delta-sigma ($\Delta\Sigma$) modulator, generates least significant bits by performing a cyclic A/D conversion of the residue of the quantization, and outputs an A/D conversion result of the analog input signal by combining the most significant bits and the least significant bits.

Each of a delta-sigma modulator and a cyclic A/D converter has an operational amplifier as their main part. In a technique disclosed in JP-B2-04862943 corresponding to U.S. Pat. No. 7,289,054 B2, a delta-sigma modulator and a cyclic A/D converter share an operation amplifier and are operated by operation mode switching.

In order to use an operational amplifier as a delta-sigma modulator and a cyclic A/D converter, multiple switches are required to change a connection condition between the operational amplifier and a capacitor which works in conjunction with the operational amplifier to form an integrator circuit or an amplifier circuit.

A switch serves as a resistor equivalently when it is ON. For this reason, if a switch is connected between an input of an operational amplifier and a capacitor, an operation speed of a circuit constructed with the operational amplifier may be degraded. The degradation in the operation speed due to the switch may be reduced by reducing an ON-resistance of the switch. However, the switch needs to be increased in size to reduce its ON-resistance. Accordingly, its circuit area is increased. In particular, since a parasitic capacitance of a switch to be connected to the operational amplifier increases with an increase in the circuit area, a feedback factor of a feedback loop constructed with the operational amplifier, the switch, and the capacitance may be reduced. Accordingly, the operation speed and accuracy of processing the analog input signal may be reduced.

Further, since a gain (generally, two or four times) of a closed loop which is formed when the operational amplifier is used as a cyclic A/D converter is greater than a gain (generally, one or less times) of a closed loop which is formed when the operational amplifier is used as a delta-sigma modulator, a gain-bandwidth product which a circuit constructed with the operational amplifier is required to have is larger. In particular, it is likely that an operation speed of the cyclic A/D converter becomes a bottleneck of an operating frequency of the circuit. For this reason, the switch exerts a larger influence on the whole operation speed when the operation amplifier is used as a cyclic A/D converter than when the operation amplifier is used as a delta-sigma modulator.

SUMMARY

In view of the above, it is an object of the present disclosure to provide a technique for reducing degradation in an operation speed due to a switch which changes a connection condition between an operation amplifier and a capacitor.

According to an aspect of the present disclosure, an A/D conversion apparatus includes a signal processor, a quantizer, and a controller.

The signal processor process an analog input signal and outputs it to the quantizer. The signal processor includes multiple circuit blocks connected in a loop so that an output of a final-stage circuit block of the circuit blocks is inputted to at least one of the circuit blocks except the final-stage circuit block. The quantizer generates a quantization value by quantizing an output of at least one of the circuit blocks including the final-stage circuit block. The controller generates control signals for causing the signal processor and the quantizer to operate as a delta-sigma modulator in a delta-sigma mode or as a cyclic A/D converter in a cyclic mode by changing a connection condition in each of the circuit blocks. The controller outputs an A/D conversion result of the analog input signal according to the quantization value.

Each of the circuit blocks of the signal processor includes an operational amplifier, a first capacitor, a second capacitor, a third capacitor, a first switch section, a second switch section, and a third switch section. One end of each of the first capacitor, the second capacitor, the third capacitor is capable of being connected to an input terminal of the operational amplifier. The first switch section changes a connection destination of the first capacitor so that in the delta-sigma mode, the first capacitor forms a first sample circuit to sample and hold a preset first target input or forms an integrator circuit with the operational amplifier and the third capacitor and so that in the cyclic mode, the first capacitor is disconnected from the input terminal of the operational amplifier. The second switch section changes a connection destination of the second capacitor so that in the delta-sigma mode, the second capacitor is connected between the input terminal and an output terminal of the operational amplifier and so that in the cyclic mode, the second capacitor forms a second sample circuit to sample and hold a preset second target input or forms an amplifier circuit with the operational amplifier and the third capacitor. The third switch section changes a connection destination of the third capacitor so that in the delta-sigma mode, the third capacitor forms the integrator circuit with the operational amplifier and the first capacitor and holds an output of the integrator circuit and so that in the cyclic mode, the third capacitor forms the amplifier circuit with the operational amplifier and the second capacitor and holds an output of the amplifier circuit.

The one end of each of the second capacitor and the third capacitor is connected directly to the input terminal of the operational amplifier. An output, which is outputted from the operational amplifier of a first one of the circuit blocks and inputted to a second one of the circuit blocks connected to an output stage of the first one of the circuit blocks in the loop, is defined as an input-stage output. The analog input signal is inputted as the first target input to a predetermined one of the circuit blocks connected to an output stage of the final-stage circuit block in the loop. The input-stage output is inputted as the second target input to the predetermined one of the circuit blocks. The input-stage output is inputted as both the first target input and the second target input to each of the circuit blocks except the predetermined one of the circuit blocks.

According to the above aspect, in the cyclic mode, there is no switch in a path connecting the one end of each of the second and third capacitors, which form the amplifier circuit with the operational amplifier, to the input terminal of the operational amplifier 16 so that the second and third capacitors can be connected directly to the input terminal of the operational amplifier 16. Further, there is no switch in a path through which charges move between the second and third capacitors. Thus, in the A/D conversion apparatus, the delta-sigma modulator and the cyclic A/D converter share the operational amplifier. Accordingly, the A/D conversion apparatus can be reduced in size. Further, in the cyclic mode, a circuit is formed with the second and third capacitors which are directly connected to the input terminal of the operational amplifier. Thus, an operation speed of the cyclic A/D converter is not degraded by an influence of a switch so that high speed operation can be achieved.

The present disclosure can be embodied in various forms such as a system having the A/D conversion apparatus.

BRIEF DESCRIPTION OF THE DRAWINGS

The above and other objects, features and advantages of the present disclosure will become more apparent from the following detailed description made with reference to the accompanying drawings. In the drawings:

FIG. 7A is a diagram for explaining blocks functioning in a sample phase of a delta-sigma mode, and FIG. 7B is a diagram for explaining blocks functioning in a hold phase of the delta-sigma mode;

FIG. 9A is a diagram for explaining blocks functioning in the odd phase of the cyclic mode, and FIG. 9B is a diagram for explaining blocks functioning in an even phase of the cyclic mode;

DETAILED DESCRIPTION

An embodiment of the present disclosure is described below with reference to the drawings.

<Overall Structure>

An analog-to-digital (A/D) conversion apparatus 1 according to the embodiment functions as a delta-sigma (ΔΣ) A/D converter for processing an analog input signal and also functions as a cyclic A/D converter for processing the residue of the quantization. Thus, the A/D conversion apparatus 1 is a hybrid A/D conversion apparatus for generating an A/D conversion result Do of the analog input signal.

Figure 1:
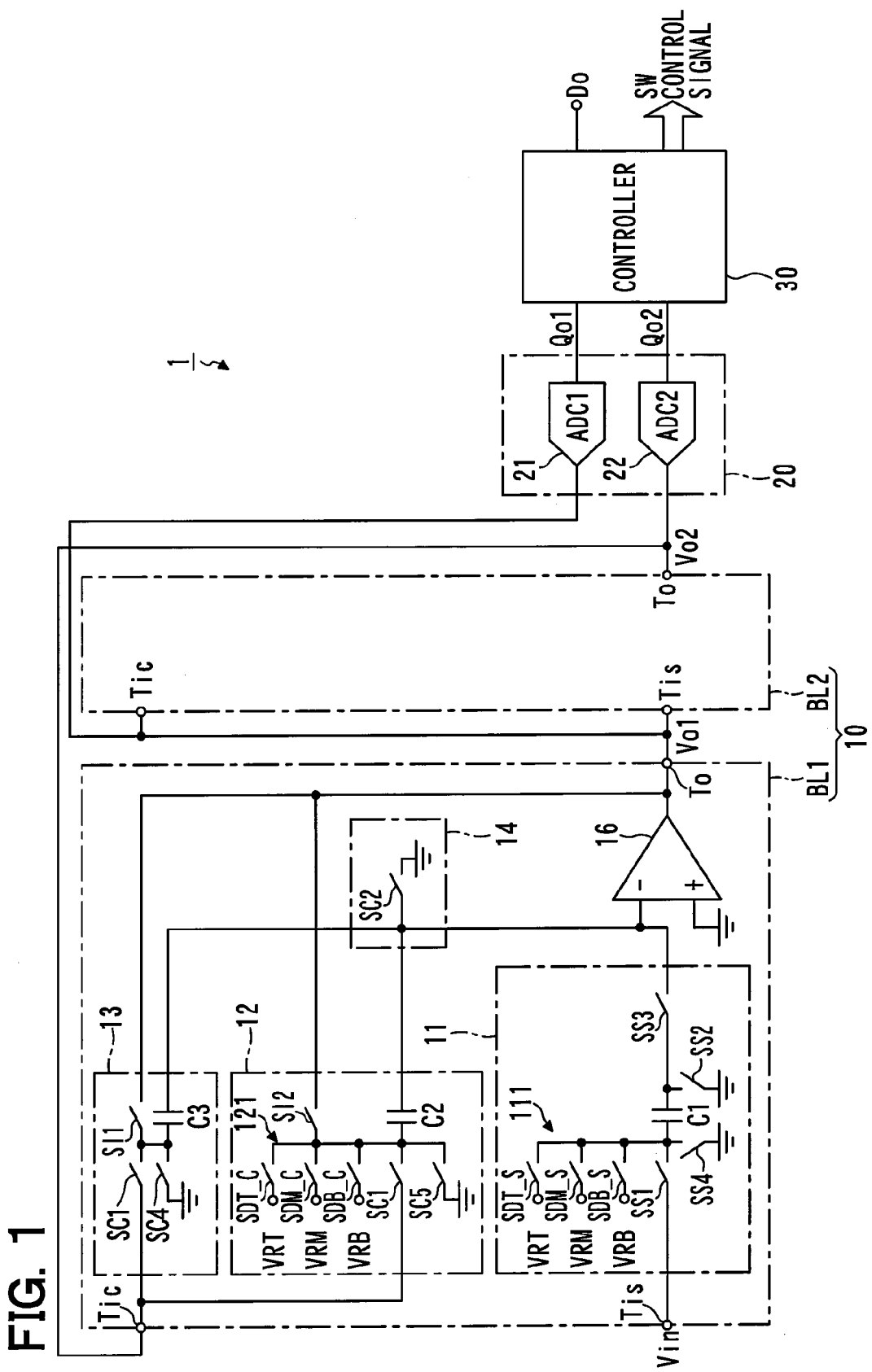
FIG. 1 is a diagram illustrating an overview of an A/D conversion apparatus according to a first embodiment of the present disclosure.

As shown in FIG. 1, the A/D conversion apparatus 1 includes a signal processor 10, a quantizer 20, and a controller 30.

<Signal Processor>

The signal processor 10 includes a first circuit block BL1 and a second circuit block BL2. Since the first circuit block BL1 and the second circuit block BL2 have the same structure except for a capacitance of a capacitor, they are hereinafter collectively referred to simply as the "circuit block BL" unless otherwise distinguished.

The circuit block BL has a delta-sigma input terminal Tis, a cyclic input terminal Tic, and an output terminal To. An analog input signal Vin as an A/D conversion target is applied to the delta-sigma input terminal Tis of the first circuit block BL1. An output voltage Vo1 outputted from the output terminal To of the first circuit block BL1 is applied to both the delta-sigma input terminal Tis and the cyclic input terminal Tic of the second circuit block BL2 and also supplied to the quantizer 20. An output voltage Vo2 outputted from the output terminal To of the second circuit block BL2 is applied to the cyclic input terminal Tic of the first circuit block BL1 and also supplied to the quantizer 20.

The circuit block BL includes a first capacitor circuit 11, a second capacitor circuit 12, a third capacitor circuit 13, a common ground circuit 14, and an operational amplifier 16.

A non-inverting input terminal of the operational amplifier 16 is connected to a ground line (i.e., analog ground) which provides a reference potential. An output terminal of the operational amplifier 16 is connected to the output terminal To of the circuit block BL.

An inverting input terminal of the operational amplifier 16 is connected to the first capacitor circuit 11, the second capacitor circuit 12, and the third capacitor circuit 13. The common ground circuit 14 has a switch SC2 connected between the inverting input terminal of the operational amplifier 16 and the analog ground.

The first capacitor circuit 11 includes a capacitor C1, switches SS1, SS2, SS3, and SS4, and a digital-to-analog (D/A) converter 111. A first end (hereinafter referred to as the "operational-amplifier-side end") of the capacitor C1 is connected through the switch SS3 to the inverting input terminal of the operational amplifier 16, and a second end (hereinafter referred to as the "non-operational-amplifier-side end") of the capacitor C1 is connected to the D/A converter 111. The switch SS1 is connected between the non-operational-amplifier-side end of the capacitor C1 and the delta-sigma input terminal Tis. The switch SS2 is connected between the operational-amplifier-side end of the capacitor C1 and the analog ground. The switch SS4 is connected between the non-operational-amplifier-side end of the capacitor C1 and the analog ground. The D/A converter 111 is connected so that it can select and apply any of conversion outputs VRT, VRM, and VRB to the non-operational-amplifier-side end of the capacitor C1 through switches SDT_S, SDM_S, and SDB_S, respectively. It is noted that the conversion outputs VRT, VRM, and VRB correspond to values generated by D/A-converting outputs of the quantizer 20. For example, the conversion outputs VRT, VRM, and VRB have the following relationship: VRT>VRM>VRB. This conversion output is not limited to three levels and can be set according to the number of quantization levels in the quantizer 20. The selected conversion output is hereinafter referred to as the "VR".

The second capacitor circuit 12 includes a capacitor C2, switches SC1, SC5, and SI2, and a digital-to-analog (D/A) converter 121. A first end (hereinafter referred to as the "operational-amplifier-side end") of the capacitor C2 is connected directly to the inverting input terminal of the operational amplifier 16, and a second end (hereinafter referred to as the "non-operational-amplifier-side end") of the capacitor C2 is connected to the D/A converter 121. The switch SC1 is connected between the non-operational-amplifier-side end of the capacitor C2 and the cyclic input terminal Tic. The switch SI2 is connected between the non-operational-amplifier-side end of the capacitor C2 and the output terminal of the operational amplifier 16. The switch SC5 is connected between the non-operational-amplifier-side end of the capacitor C2 and the analog ground. Like the D/A converter 111, the D/A converter 121 is connected so that it can select and apply any of conversion outputs VRT, VRM, and VRB through switches SDT_C, SDM_C, and SDB_C, respectively.

The third capacitor circuit 13 includes a capacitor C3 and switches SC1, SC4, and SI1. A first end (hereinafter referred to as the "operational-amplifier-side end") of the capacitor C3 is connected directly to the inverting input terminal of the operational amplifier 16. The switch SC1 is connected between a second end (hereinafter referred to as the "non-operational-amplifier-side end") of the capacitor C3 and the cyclic input terminal Tic. The switch SC4 is connected between the non-operational-amplifier-side end of the capacitor C3 and the analog ground.

It is noted that the switch SC1 of the second capacitor circuit 12 is different from the switch SC1 of the third capacitor circuit 13. However, since these switches SC1 are always turned ON and OFF at the same timing, they are represented by the same symbol. Although there are switches represented by the same symbol in the first circuit block BL1 and the second circuit block BL2, the switches represented by the same symbol in different circuit blocks are controlled independently of each other and not always turned ON and OFF at the same timing. For example, the switch SI2 of the second capacitor circuit 12 of the first circuit block BL1 can be controlled independently of the switch SI2 of the second capacitor circuit 12 of the second circuit block BL2.

<Circuit Block Operation>

The circuit block BL has five operation states: a reset operation, a delta-sigma sample operation, a delta-sigma hold operation, a cyclic sample operation, and a cyclic hold operation.

<<Reset Operation>>

Figure 2:
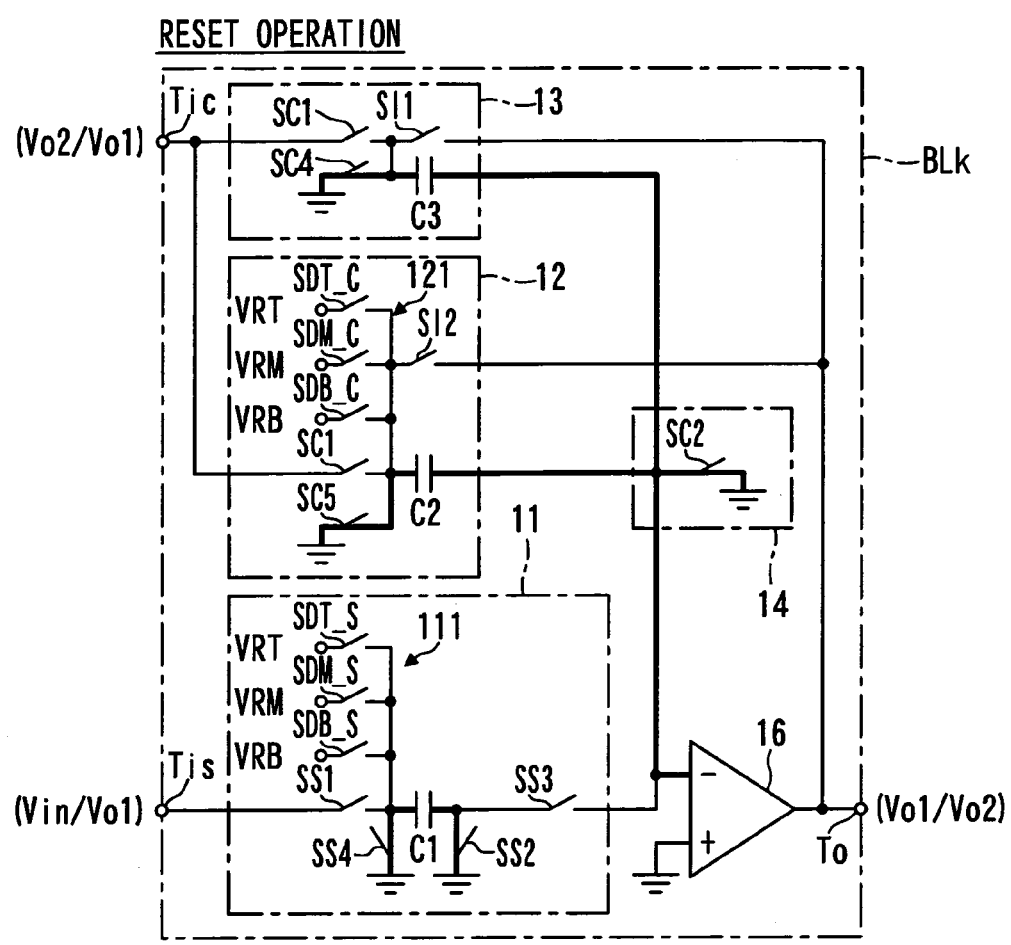
FIG. 2 is a diagram for explaining connection conditions in a circuit block in a reset operation.

In the reset operation, the controller 30 turns ON the switches SS2, SS4, SC2, SC4, and SC5 and turns OFF the other switches. In this operation state, as shown in FIG. 2, both ends of the capacitors C1, C2, and C3 are connected to the analog ground so that all the capacitors C1, C2, and C3 can be reset i.e., fully discharged.

<<Delta-Sigma Sample Operation>>

In the delta-sigma sample operation, the controller 30 turns ON the switches SS1, SS2, SI1, and SI2 and turns OFF the other switches.

Figure 3A:
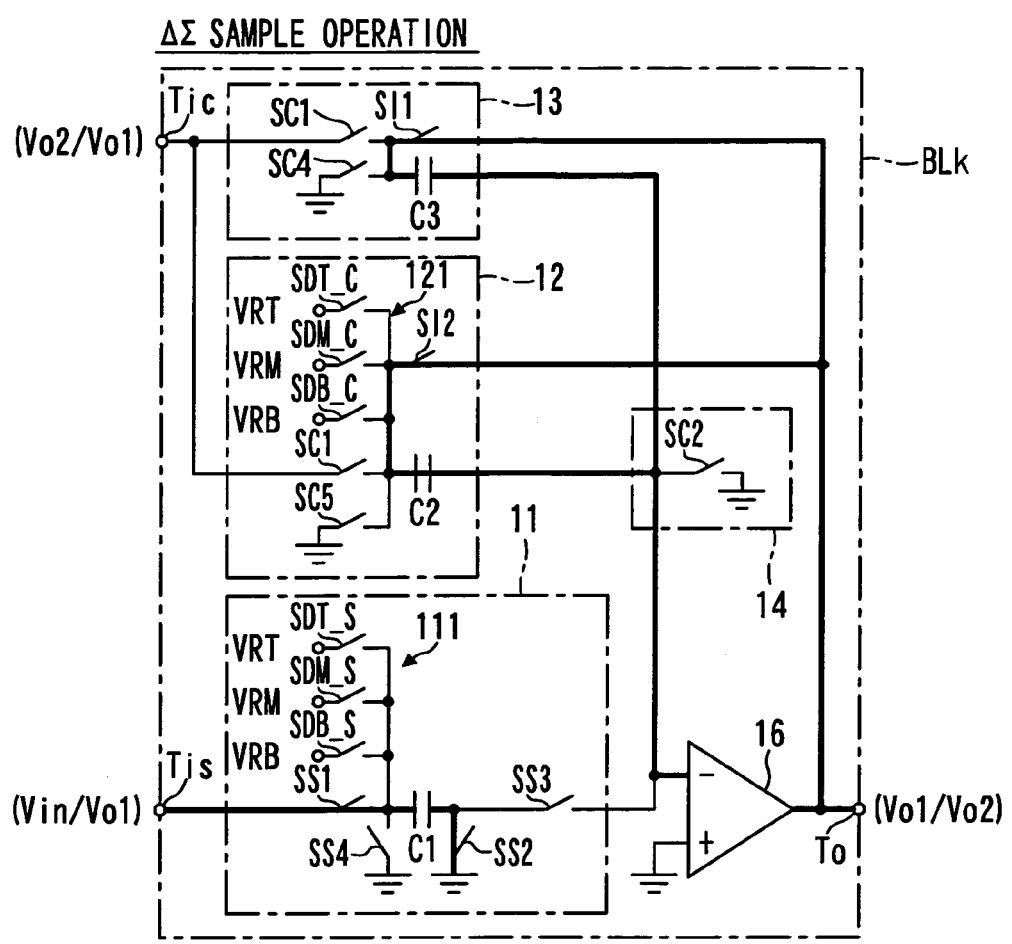
FIG. 3A is a diagram for explaining connection conditions in a circuit block in a delta-sigma sample operation.

In this operation state, as shown in FIG. 3A, the capacitor C1 is charged by a voltage applied to the delta-sigma input terminal Tis. On the other hand, the capacitors C2 and C3 are connected in parallel between the inverting input terminal and the output terminal of the operational amplifier 16. Thus, the output voltage Vo, which is outputted from the output terminal To, is equal to a voltage generated by charges stored in the capacitors C2 and C3.

<<Delta-Sigma Hold Operation>>

In the delta-sigma hold operation, the controller 30 turns ON the switches SS3, SI1, SI2, and any one of the switches SDT_S, SDM_S, and SDB_S and turns OFF the other switches.

Figure 3B:
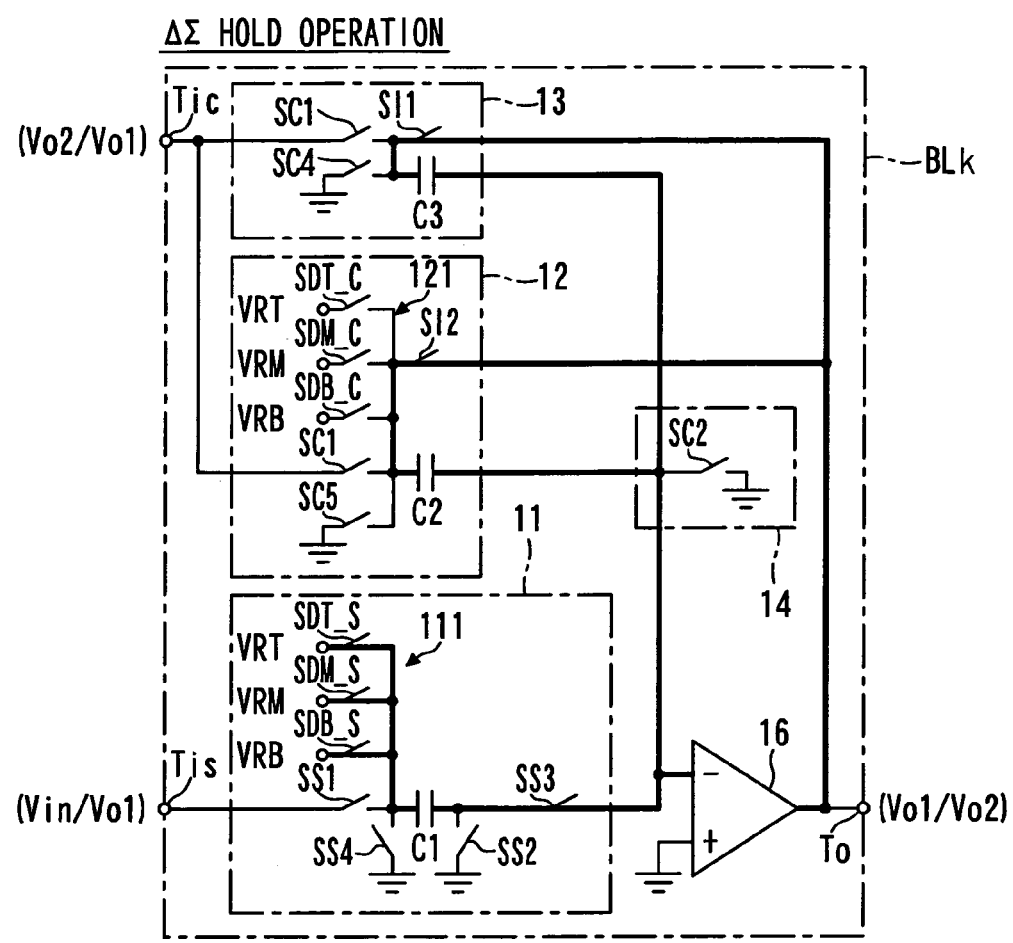
FIG. 3B is a diagram for explaining connection conditions in the circuit block in a delta-sigma hold operation.

In this operation state, as shown in FIG. 3B, an integrator circuit is formed by the operational amplifier 16 and the capacitors C1, C2, and C3, so that a residual charge, which is obtained by subtracting a charge depending on the conversion output VR supplied from the D/A converter 111 from the charge stored in the capacitor C1 by the voltage applied to the delta-sigma input terminal Tis in the delta-sigma sample operation, moves to and is stored in the capacitors C2 and C3.

<<Cyclic Sample Operation>>

Figure 4A:
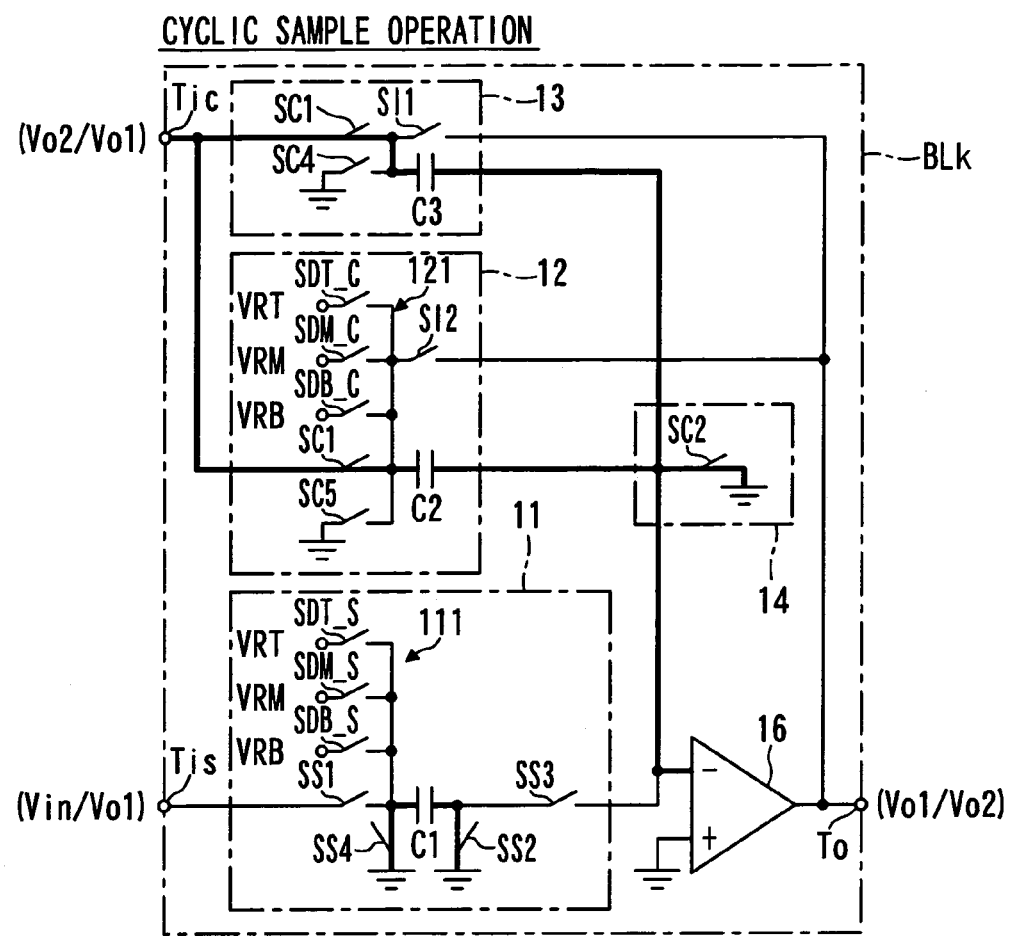
FIG. 4A is a diagram for explaining connection conditions in the circuit block in a cyclic sample operation.

In the cyclic sample operation, the controller 30 turns ON the switches SC1, SC2, SS2, and SS4 and turns OFF the other switches. In this operation state, as shown in FIG. 4A, the capacitors C2 and C3 are charged by an input voltage to the cyclic input terminal Tic, i.e., the output voltage Vo of the circuit block BL connected to its input stage. It is noted that the switches SS2 and SS4 are not always necessary to be turned ON in this operation state. However, in the embodiment, to prevent potentials of both ends of the capacitor C1 from fluctuating, the switches SS2 and SS4 are turned ON so that the ends of the capacitor C1 can be connected to the analog ground.

<<Cyclic Hold Operation>>

In the cyclic hold operation, the controller 30 turns ON the switch SI1, SS2, SS4, and any one of the switches SDT_C, SDM_C, and SDB_C and turns OFF the other switches. Although the switches SS2 and SS4 are not always necessary to be turned ON in this operation state, they are turned ON for the same reason as described above for the cyclic sample operation.

Figure 4B:
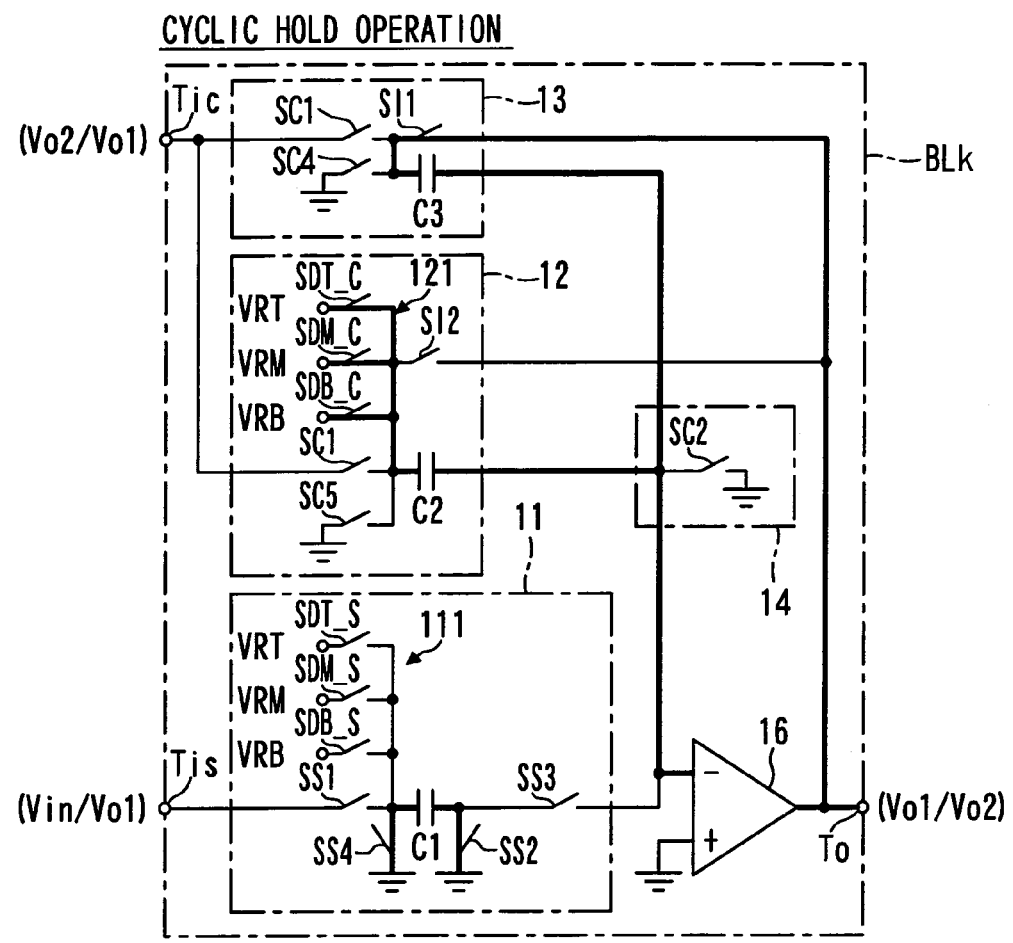
FIG. 4B is a diagram for explaining connection conditions in the circuit block in a cyclic hold operation.

In this operation state, as shown in FIG. 4B, a residual charge, which is obtained by subtracting a charge depending on the conversion output VR supplied from the D/A converter 121 from the charge stored in the capacitors C2 and C3 by the voltage applied to the cyclic input terminal Tic in the cyclic sample operation, is redistributed between the capacitors C2 and C3. Thus, a voltage (i.e., residual voltage) across the capacitor C3 becomes equal to a value which is obtained by subtracting a first value from a second value. The first value is calculated by amplifying the conversion output VR by a gain (e.g., 1) which is determined by capacitances of the capacitors C2 and C3. The second value is calculated by amplifying the voltage applied to the cyclic input terminal Tic by a gain (e.g., 2) which is determined by the capacitances of the capacitors C2 and C3. An output voltage Vo equal to the voltage across the capacitor C3 is outputted from the output terminal To.

<Quantizer>

Returning to FIG. 1, the quantizer 20 includes an A/D converter 21 and an A/D converter 22. The A/D converter 21 performs A/D conversion of a signal level of the output voltage Vo1 of the first circuit block BL1. The A/D converter 22 performs A/D conversion of a signal level of the output voltage Vo2 of the second circuit block BL2. The A/D converter 21 produces three-level (i.e., 1.5-bit) digital data as a quantization value Qo1. Likewise, the A/D converter 22 produces three-level (i.e., 1.5-bit) digital data as a quantization value Qo2. The quantization values Qo1 and Qo2 are not limited to three levels, but can be two levels or four or more levels. The number of levels of the conversion output VR set in the D/A converter 111, 121 can vary depending on the number of the quantization levels.

<Controller>

The controller 30 generates a switch control signal to control each switch of the signal processor 10, thereby causing the signal processor 10 and the quantizer 20 to operate in a delta-sigma mode or a cyclic mode. Further, the controller 30 generates the A/D conversion result Do, which is the result of A/D conversion of the analog input signal, based on the quantization values Qo1 and Qo2 generated by the quantizer 20.

Figure 5:
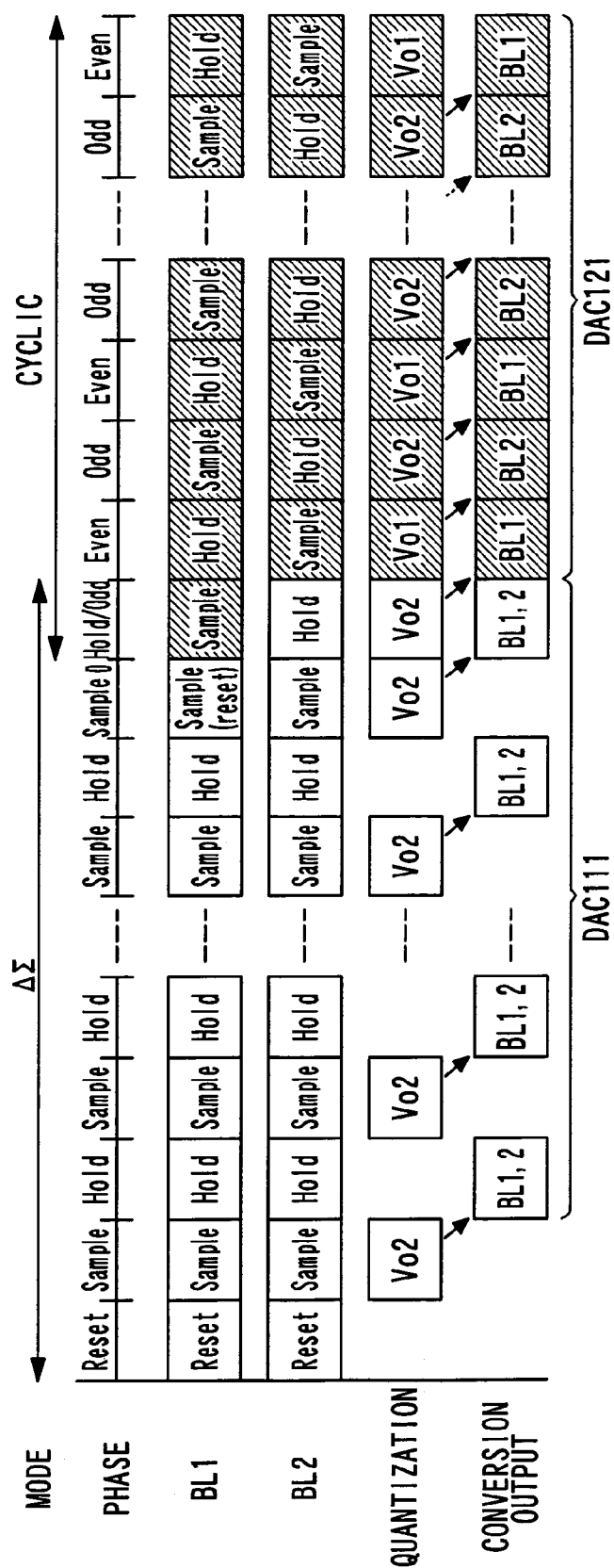
FIG. 5 is a timing diagram of the A/D conversion apparatus.

Next, one cycle of a procedure to generate one A/D conversion result Do is described below with reference to a timing diagram of FIG. 5. In FIG. 5, non-shaded areas represent processes related to the delta-sigma mode, and shaded areas represent processes related to the cyclic mode.

The controller 30 firstly causes each of the signal processor 10 and the quantizer 20 to operate in the delta-sigma mode and then causes each of the signal processor 10 and the quantizer 20 to operate in the cyclic mode. The delta-sigma mode has three phases: a reset phase (Reset), a sample phase (Sample), and a hold phase (Hold). In the delta-sigma mode, the controller 30 firstly performs the reset phase once and then repeatedly and alternately performs the sample phase and the hold phase a predetermined number of times. In each phase of the delta-sigma mode, each of the circuit blocks BL1 and BL2 is put into the same operation state. Specifically, the circuit blocks BL1 and BL2 are in the reset state in the reset phase, are in the delta-sigma sample state in the sample phase, and are in the delta-sigma hold state in the hold phase.

It is noted that the analog input signal Vin sampled in the sample phase (represented as "Sample0" in FIG. 5) just before a transition from the delta-sigma mode to the cyclic mode is not transmitted to the cyclic mode. For this reason, in the sample phase just before the transition from the delta-sigma mode to the cyclic mode, the first capacitor circuit 11 is put into the reset state by turning OFF the switch SS1 and by turning ON the switch SS4 in FIG. 3A (refer to the first capacitor circuit 11 in FIG. 2, which shows the reset state).

The cyclic mode has two phases: an odd phase (Odd) and an even phase (Even). In the cyclic mode, the controller 30 repeatedly and alternately performs the odd phase and the even phase a predetermined number of times. In each phase of the cyclic mode, the circuit blocks BL1 and BL2 are put into different operation states. Specifically, in the odd phase, the first circuit block BL1 is in the cyclic sample state, and the second circuit block BL2 is in the cyclic hold state. In contrast, in the even phase, the first circuit block BL1 is in the cyclic hold state, and the second circuit block BL2 is in the cyclic sample state.

However, the hold phase performed for the last time in the delta-sigma mode overlaps the even phase performed for the first time in the cyclic mode. Accordingly, the first circuit block BL1 is put into the cyclic sample state and operates in the cyclic mode while the second circuit block BL2 is put into the delta-sigma hold state and operates in the delta-sigma mode.

In the delta-sigma mode, the output voltage Vo2 of the second circuit block BL2 is quantized to the quantization value Qo2 in the sample phase, and the conversion output VR of the D/A converter 111 of each of the circuit blocks BL1 and BL2 caused to operate is set according to the quantization value Qo2 in the hold phase subsequent to the sample phase. It is noted that in the last hold phase, the output voltage Vo2 of the second circuit block BL2 is quantized.

On the other hand, in the cyclic mode, in the odd phase, the output voltage Vo2 of the second circuit block BL2 is quantized, and the conversion output VR of the D/A converter 121 of the second circuit block BL2 is set according to the quantization value Qo1 which has been obtained in the just previous even phase. In the even phase, the output voltage Vo1 of the first circuit block BL1 is quantized, and the conversion output VR of the D/A converter 121 of the first circuit block BL1 is set according to the quantization value Qo2 which has been obtained in the just previous odd phase.

Figure 6:
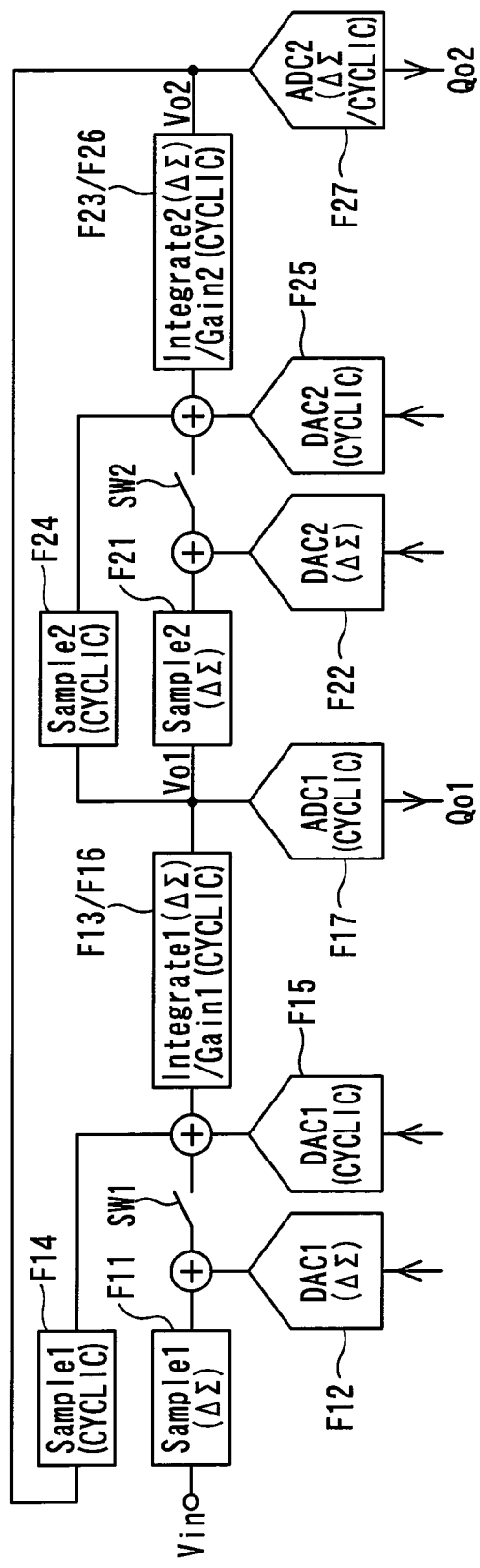
FIG. 6 is a functional block diagram illustrating a functional connection relationship between a signal processor and a quantizer.

FIG. 6 is a block diagram in which the signal processor 10 and the quantizer 20 are represented in units of functions. In FIG. 6, functional blocks F11-F16 and a switch SW1 represent functions of the first circuit block BL1, functional blocks F21-F26 and a switch SW2 represent functions of the second circuit block BL2, and functional blocks F17 and F27 represent functions of the quantizer 20. Further, the functional block Fk1 (k=1, 2) corresponds to the capacitor C1, the functional block Fk2 corresponds to the D/A converter 111, the functional block Fk3 corresponds to the operational amplifier 16 and the capacitors C2 and C3 used in the delta-sigma hold operation, the functional block Fk4 corresponds to the capacitors C2 and C3 used in the cyclic sample operation, the functional block Fk5 corresponds to the D/A converter 121 of the second capacitor circuit 12, the functional block Fk6 corresponds to the operational amplifier 16 and the capacitors C2 and C3 used in the cyclic hold operation, and the switch SWk corresponds to the switch SS3. Further, the functional block F17 corresponds to the A/D converter 21 of the quantizer 20, the functional block F27 corresponds to the A/D converter 22 of the quantizer 20. The quantization value Qok, which is an output of the functional block Fk7, is supplied to the controller 30, and the conversion output VR of the functional blocks Fk2 and Fk5 is set according to a command from the controller 30.

FIGS. 7A and 7B, FIG. 8, and FIGS. 9A and 9B show functional blocks contributing to an operation of the A/D conversion apparatus 1 in each phase (except the reset phase) of the delta-sigma mode and the cyclic mode and also show connection conditions between the functional blocks. In these figures, the functional blocks contributing to the operation are indicated by a bold solid line, and functional blocks not contributing to the operation are indicated by a broken line.

As shown in FIG. 7A, in the sample phase of the delta-sigma mode, the functional block F11 samples the analog input signal Vin, and the functional block F21 samples the output voltage Vo1 which has been held by the functional block F13 in the just previous hold phase. Further, the functional block F27 generates the quantization value Qo2 from the output voltage Vo2 which has been held by the functional block F23 in the just previous hold phase.

As shown in FIG. 7B, in the hold phase of the delta-sigma mode, the functional block F13 calculates an integral of a result of a subtraction of the conversion output VR, which is outputted from the functional block F12 according to the quantization value Qo2 generated in the just previous sample phase, from the sampled value held by the functional block F11 in the just previous sample phase and holds the calculated integral. Likewise, in the hold phase of the delta-sigma mode, the functional block F23 calculates an integral of a result of a subtraction of the conversion output VR, which is outputted from the functional block F22 according to the quantization value Qo2 generated in the just previous sample phase, from the sampled value held by the functional block F21 in the just previous sample phase and holds the calculated integral.

By repeating the sample phase and the hold phase, the analog input signal Vin is converted into a pulse stream (i.e., a time series of the quantization values Qo2) by delta-sigma modulation. That is, in the delta-sigma mode, the signal processor 10, the quantizer 20, and the controller 30 work in conjunction with one another as a second-order feedback delta-sigma modulator. The controller 30 generates most significant bits of the A/D conversion result by counting the pulse stream.

Figure 8:
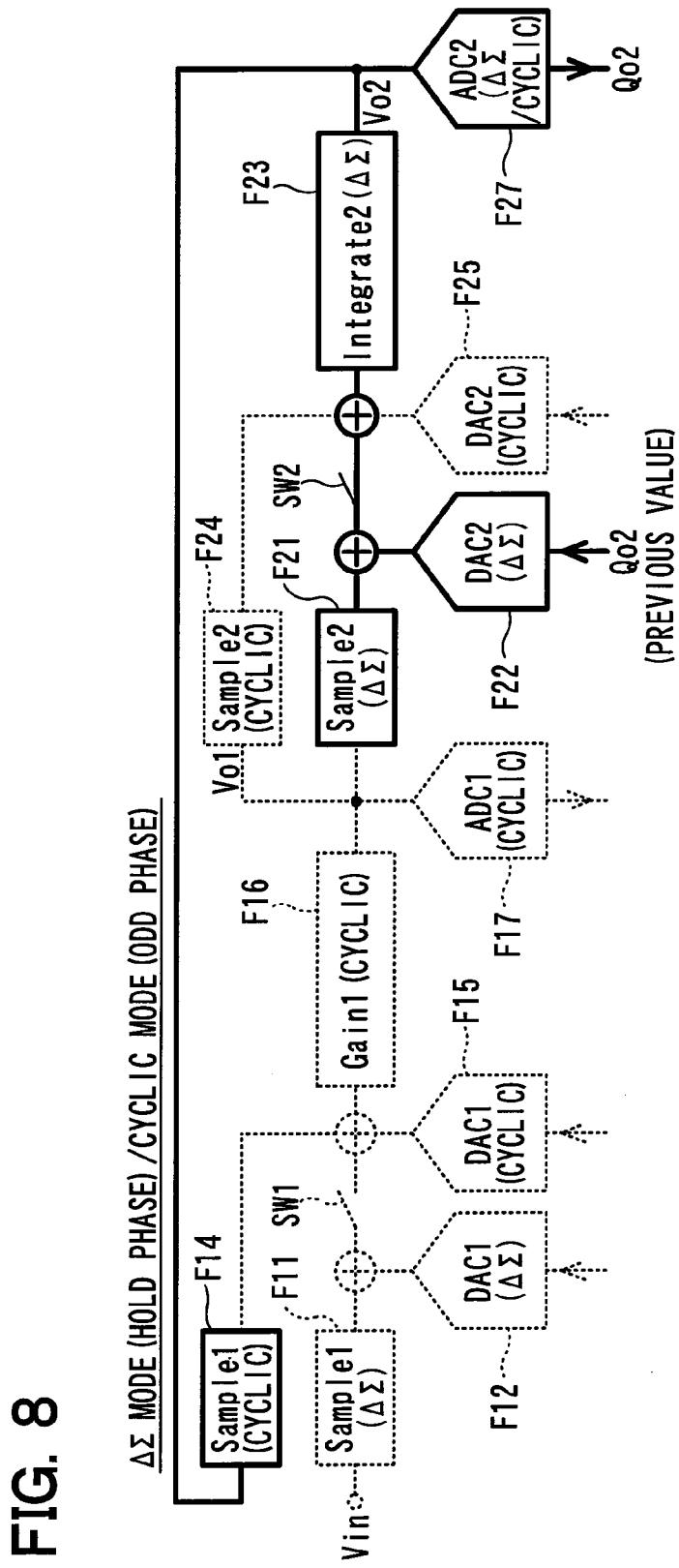
FIG. 8 is a diagram for explaining blocks functioning in a phase where the sample phase of the delta-sigma mode and an odd phase of a cyclic mode overlap.

As shown in FIG. 8, in the phase where the hold phase of the delta-sigma mode overlaps the odd phase of the cyclic mode, the functional block F23 calculates an integral of a result of a subtraction of the conversion output VR, which is outputted from the functional block F22 according to the quantization value Qo2 generated in the just previous sample phase, from the sampled value held by the functional block F21 in the just previous sample phase and holds the calculated integral. Further, the functional block F27 generates the quantization value Qo2 from the output voltage Vo2 held by the functional block F23. At the same time, the functional block F14 samples and holds the output voltage Vo2 held by the functional block F23. Thus, the functional block F24 samples a residue of the quantization performed in the delta-sigma mode.

As shown in FIG. 9A, in the odd phase of the cyclic mode, the functional block F26 amplifies and holds a result of a subtraction of the conversion output VR, which is outputted from the functional block F25 according to the quantization value Qo1 generated in the just previous even phase, from the sampled value held by the functional block F24 in the just previous even phase. Further, the functional block F27 generates the quantization value Qo2 from the output voltage Vo2 held by the functional block F26. At the same time, the functional block F14 samples and holds the output voltage Vo2 held by the functional block F26.

In the even phase of the cyclic mode, the functional block F16 amplifies and holds a result of a subtraction of the conversion output VR, which is outputted from the functional block F15 according to the quantization value Qo1 obtained in the just previous odd phase, from the sampled value held by the functional block F14 in the just previous odd phase. Further, the functional block F17 generates the quantization value Qo1 from the output voltage Vo1 held by the functional block F16. At the same time, the functional block F24 samples and holds the output voltage Vo1 held by the functional block F16.

That is, in the cyclic mode, the circuit blocks BL1 and BL2 operates alternately to achieve functions of a cyclic A/D converter. The controller 30 generates least significant bits of the A/D conversion result by sequentially adding the quantization values Qo1 and Qo2 while shifting digits. Then, the controller 30 generates the A/D conversion result Do by combining the most significant bits generated in the delta-sigma mode with the least significant bits generated in the cyclic mode.

<Effect>

As described above, according to the embodiment, in the cyclic mode, there is no switch in a path connecting the capacitors C2 and C3, which work in conjunction with the operational amplifier 16 to form an amplifier circuit, to the input terminal of the operational amplifier 16 so that the capacitors C2 and C3 can be connected directly to the input terminal of the operational amplifier 16. Thus, in the A/D conversion apparatus 1, the delta-sigma modulator and the cyclic A/D converter share the operational amplifier 16. Accordingly, the A/D conversion apparatus 1 can be reduced in size. Further, in the cyclic mode, a circuit is formed with the capacitors C2 and C3 which are directly connected to the input terminal of the operational amplifier 16. Thus, the operation speed of the cyclic A/D converter is not degraded by the influence of the switches so that high speed operation can be achieved.

(Modifications)

While the present disclosure has been described with reference to the embodiment, it is to be understood that the disclosure is not limited to the embodiment. The present disclosure is intended to cover various modifications and equivalent arrangements inside the spirit and scope of the present disclosure. For example, the embodiment can be modified as follows.

Figure 10:
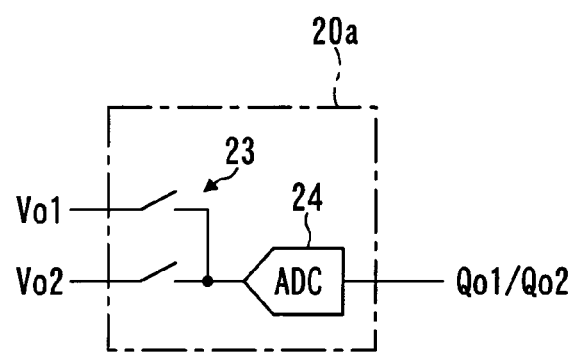
FIG. 10 is a diagram illustrating a quantizer according to a modification.
Figure 11:
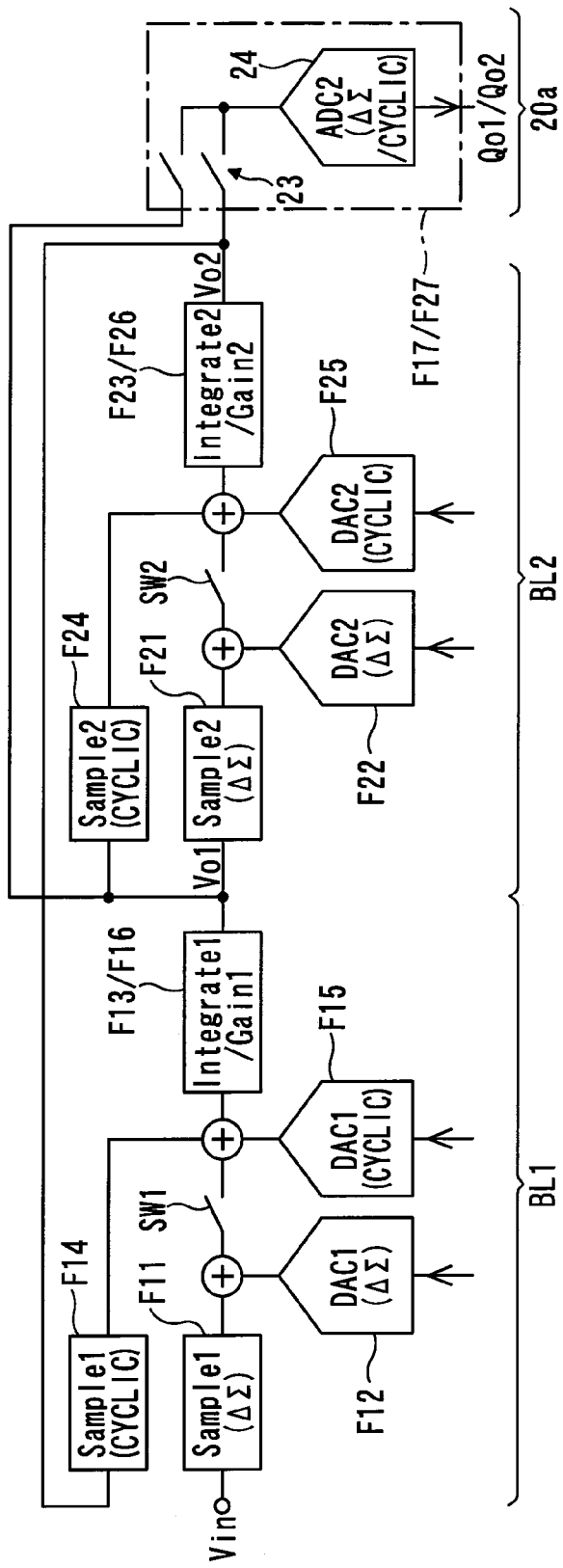
FIG. 11 is a functional block diagram when the quantizer of FIG. 10 is used.

(1) In the embodiment, the quantizer 20 includes the A/D converter 21 for the circuit block BL1 and the A/D converter 22 for the circuit block BL2. However, as can be seen from FIG. 5, there is no phase where both the output voltages Vo1 and Vo2 of the circuit blocks BL1 and BL2 need to be simultaneously quantized. For this reason, the quantizer 20 can be replaced with a quantizer 20a shown in FIG. 10. The quantizer 20a includes a selector circuit 23 for selecting one of the output voltages Vo1 and Vo2 and a single A/D converter 24 for performing A/D conversion of the selected output voltage. FIG. 11 shows a functional block diagram when the quantizer 20a is used.

Figure 12:
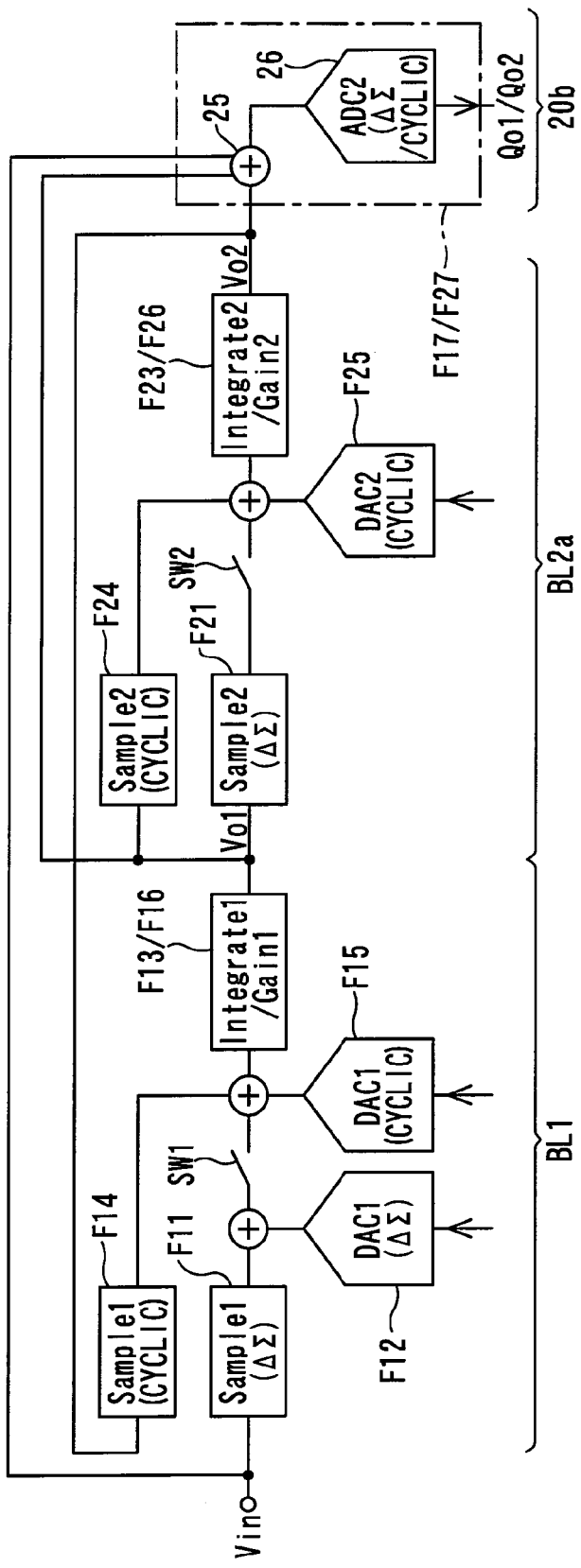
FIG. 12 is a functional block diagram of an A/D conversion apparatus having a function to achieve a CIFF delta-sigma modulator in a delta-sigma mode.

(2) In the embodiment, the signal processor 10 is configured to operate as a second-order feedback delta-sigma modulator in the delta-sigma mode. Alternatively, the signal processor 10 can be configured to operate as other types of delta-sigma modulator. For example, the signal processor 10 can be configured to operate as a second-order cascade of integrators with feedforward (CIFF) delta-sigma modulator, which is a typical example of a feedforward delta-sigma modulator. In this case, the second circuit block BL2 and the quantizer 20 are respectively replaced with a second circuit block BL2a and a quantizer 20b shown in FIG. 12. The second circuit block BL2a differs from the second circuit block BL2 in that the second circuit block BL2a does not have the components of the second circuit block BL2 from the first capacitor circuit 11 to the D/A converter 111 (i.e., functional block F22). The quantizer 20b includes an adder 25 and an A/D converter 26. The adder 25 performs a weighting addition of the input signal Vin to the first circuit block BL1 and the output voltage Vo of each of the circuit blocks BL1 and BL2a. The A/D converter 26 quantizes a result of the addition performed by the adder 25. In such a CIFF delta-sigma modulator, the amplitude of an output signal of an integrator circuit can be reduced without a reduction in its gain. Thus, compared to a feedback delta-sigma modulator, a CIFF delta-sigma modulator can increase an input-referred gain of the residue inputted to the cyclic A/D converter, thereby improving effective resolution.

(3) In the embodiment, the signal processor 10 includes two circuit blocks BL1 and BL2. Alternatively, the signal processor 10 can include three or more circuit blocks.

(4) In the embodiment, the operational-amplifier-side ends of the capacitors C2 and C3 are connected to the analog ground by using the common ground circuit 14. Alternatively, the common ground circuit 14 can be omitted by providing the second capacitor circuit 12 with a switch capable of connecting the operational-amplifier-side end of the capacitor C2 to the analog ground and by providing the third capacitor circuit 13 with a switch capable of connecting the operational-amplifier-side end of the capacitor C3 to the analog ground.

(5) In the embodiment, the second capacitor circuit 12 has the switch SI2 so that the capacitor C2 can be used as a capacitance to accumulate the integral in the delta-sigma mode. Alternatively, the second capacitor circuit 12 can be used only in the cyclic mode by omitting the switch SI2.

(6) In the embodiment, the capacitors C1, C2, and C3 are used. Besides these capacitors, another capacitor which is connected between the input and output terminals of the operational amplifier 16 (i.e., connected in parallel with the capacitors C2 and C3) only in the delta-sigma mode can be added.

(7) In the embodiment, the capacitor C1 has a first function to serve as a sampling circuit for sampling an input signal and a second function to serve as a D/A converter. Alternatively, the capacitor C1 can be replaced with multiple capacitors including a first capacitor specialized to serve as the sampling circuit and a second capacitor specialized to serve as the D/A converter. In this case, gains of the sampling circuit and the D/A converter can be adjusted individually.

(8) In the embodiment, the first circuit block BL1 and the second circuit block BL2 are configured as a single-ended circuit where a signal is inputted to one input of an operational amplifier and a reference potential (i.e., analog ground) is inputted to the other input of the operational amplifier. Alternatively, a differential circuit where differential signals are inputted to a fully-differential or pseudo-differential operational amplifier can be used.

(9) In the embodiment, the switches SS4 and SC5 are provided in addition to the D/A converters 111 and 121. Alternatively, when any (e.g., VRM) of the conversion outputs VRT, VRM, and VRB is set to the same potential as the analog ground, the switches SS4 and SC 5 can be omitted. In this case, switches (e.g., SDB_S and SDB_C) for applying the same potential as the analog ground are turned ON and OFF.

Such changes and modifications are to be understood as being inside the scope of the present disclosure as defined by the appended claims.

What is claimed is:

1. An analog-to-digital (A/D) conversion apparatus comprising:
    a signal processor configured to process an analog input signal and including a plurality of circuit blocks connected in a loop so that an output of a final-stage circuit block of the plurality of circuit blocks is inputted to at least one of the plurality of circuit blocks except the final-stage circuit block;
    a quantizer configured to generate a quantization value by quantizing an output of at least one of the plurality of circuit blocks including the final-stage circuit block, and
    a controller configured to generate control signals for causing the signal processor and the quantizer to operate as a delta-sigma modulator in a delta-sigma mode or as a cyclic A/D converter in a cyclic mode by changing a connection condition in each of the plurality of circuit blocks, the controller configured to output an A/D conversion result of the analog input signal according to the quantization value, wherein
    each of the plurality of circuit blocks of the signal processor includes an operational amplifier, a first capacitor, a second capacitor, a third capacitor, a first switch section, a second switch section, and a third switch section,
    one end of each of the first capacitor, the second capacitor, the third capacitor is capable of being connected to an input terminal of the operational amplifier,
    the first switch section changes a connection destination of the first capacitor so that in the delta-sigma mode, the first capacitor forms a first sample circuit to sample and hold a preset first target input or forms an integrator circuit with the operational amplifier and the third capacitor and so that in the cyclic mode, the first capacitor is disconnected from the input terminal of the operational amplifier,
    the second switch section changes a connection destination of the second capacitor so that in the delta-sigma mode, the second capacitor is connected between the input terminal and an output terminal of the operational amplifier and so that in the cyclic mode, the second capacitor forms a second sample circuit to sample and hold a preset second target input or forms an amplification circuit with the operational amplifier and the third capacitor,
    the third switch section changes a connection destination of the third capacitor so that in the delta-sigma mode, the third capacitor forms the integrator circuit with the operational amplifier and the first capacitor and holds an output of the integrator circuit and so that in the cyclic mode, the third capacitor forms the amplifier circuit with the operational amplifier and the second capacitor and holds an output of the amplifier circuit,
    the one end of each of the second capacitor and the third capacitor is connected directly to the input terminal of the operational amplifier,
    an output, which is outputted from the operational amplifier of a first one of the plurality of circuit blocks and inputted to a second one of the plurality of circuit blocks connected to an output stage of the first one of the plurality of circuit blocks in the loop, is defined as an input-stage output,
    the analog input signal is inputted as the first target input to a predetermined one of the plurality of circuit blocks connected to an output stage of the final-stage circuit block in the loop,
    the input-stage output is inputted as the second target input to the predetermined one of the plurality of circuit blocks, and
    the input-stage output is inputted as both the first target input and the second target input to each of the plurality of circuit blocks except the predetermined one of the plurality of circuit blocks.

2. The A/D conversion apparatus according to claim 1, wherein
    the first switch section includes a first switch, a second switch, and a third switch, the first switch configured to apply a reference potential to the one end of the first capacitor, the second switch configured to connect and disconnect the one end of the first capacitor to and from the input terminal of the operational amplifier, the third switch configured to apply any one of the reference potential, the first target input, and a conversion output as an A/D conversion value according to the quantization value to the other end of the first capacitor,
    the second switch section includes a fourth switch, a fifth switch, and a sixth switch, the fourth switch configured to apply the reference potential to the one end of the second capacitor, the fifth switch configured to connect and disconnect the other end of the second capacitor to and from the output terminal of the operational amplifier, the sixth switch configured to apply any one of the reference potential, the input-stage output, and the conversion output to the other end of the second capacitor, and
    the third switch section includes a seventh switch, an eighth switch, and a ninth switch, the seventh switch configured to apply the reference potential to the one end of the third capacitor, the eighth switch configured to connect and disconnect the other end of the third capacitor to and from the output terminal of the operational amplifier, the ninth switch configured to apply any one of the reference potential and the input-stage output to the other end of the third capacitor.

3. The A/D conversion apparatus according to claim 2, wherein
the quantizer includes a plurality of A/D converters, and
each of the plurality of A/D converters quantizes an output of the operational amplifier of a corresponding one of the plurality of circuit blocks.

4. The A/D conversion apparatus according to claim 2, wherein
the quantizer includes a selector circuit and an A/D converter,
the selector circuit selects any one of outputs of the plurality of circuit blocks in accordance with a command from the controller, and
the A/D converter quantizes the output selected by the selector circuit.

5. The A/D conversion apparatus according to claim 1, wherein
the plurality of circuit blocks includes a first circuit block and a second circuit block,
the first switch section of the first circuit block includes a first switch, a second switch, and a third switch, the first switch configured to apply a reference potential to the one end of the first capacitor, the second switch configured to connect and disconnect the one end of the first capacitor to and from the input terminal of the operational amplifier, the third switch configured to apply any one of the reference potential, the first target input, and a conversion output as a digital-to-analog conversion value according to the quantization value to the other end of the first capacitor,
the second switch section of the first circuit block includes a fourth switch, a fifth switch, and a sixth switch, the fourth switch configured to apply the reference potential to the one end of the second capacitor, the fifth switch configured to connect and disconnect the other end of the second capacitor to and from the output terminal of the operational amplifier, the sixth switch configured to apply any one of the reference potential, the input-stage output, and the conversion output to the other end of the second capacitor,
the third switch section of the first circuit block includes a seventh switch and an eighth switch, the seventh switch configured to apply the reference potential to the one end of the third capacitor, the eighth switch configured to apply the output of the first circuit block or the input-stage output to the other end of the third capacitor,
the second circuit block is configured in the same manner as the first circuit block except that the third switch is configured to apply the reference potential or the first target input to the other end of the first capacitor,
the quantizer includes an adder and an A/D converter,
the adder performs a weighting addition of the analog input signal and the output of the operational amplifier of each of the first circuit block and the second circuit block according to operating states, and
the A/D converter quantizes a result of the addition performed by the adder.

6. The A/D conversion apparatus according to claim 2, wherein
the sixth switch serves as the ninth switch.

7. The A/D conversion apparatus according to claim 2, wherein
in the first switch section or the second switch section, the conversion output is set in a plurality of levels including the reference potential, and
the third switch or the sixth switch serves as a switch configured to apply the reference potential to the other end of the first capacitor or the second capacitor.

\* \* \* \* \*